United States Patent [19]
Mills

[11] 3,979,763
[45] Sept. 7, 1976

[54] CIRCUIT BOARD ARRANGEMENT FOR COLLAPSIBLE CAMERA APPARATUS
[75] Inventor: Loring K. Mills, Hampton, N.H.
[73] Assignee: Polaroid Corporation, Cambridge, Mass.
[22] Filed: Aug. 5, 1974
[21] Appl. No.: 494,472

[52] U.S. Cl. .................................. 354/187; 174/86; 317/101 F; 339/17 F; 354/202; 354/354
[51] Int. Cl.$^2$ .................. G03B 17/04; H02G 15/08
[58] Field of Search ............ 354/202, 354, 187–194; 339/4, 17 F, 176 MF; 317/101 F; 174/86, 117 FF

[56] References Cited
UNITED STATES PATENTS
3,818,122   6/1974   Luetzow .............................. 174/86

Primary Examiner—L. T. Hix
Assistant Examiner—James LaBarre
Attorney, Agent, or Firm—Edward S. Roman

[57] ABSTRACT

A collapsible camera apparatus of a type having at least two sections connected in pivotal relation to each other with a substantially planar surface associated with one section pivotal about a line orthogonal to a second substantially planar surface associated with the other section, further includes circuit board means angularly and permanently prefolded in interconnecting relation between the planar surfaces in a manner whereby the angular prefold remains substantially uneffected by pivotal motion between the sections. The circuit board is arranged to flex in a gradual manner over an extended length portion thereof thus accommodating pivotal motion between the camera sections without flexing the printed circuit board means about its angular prefold.

5 Claims, 12 Drawing Figures

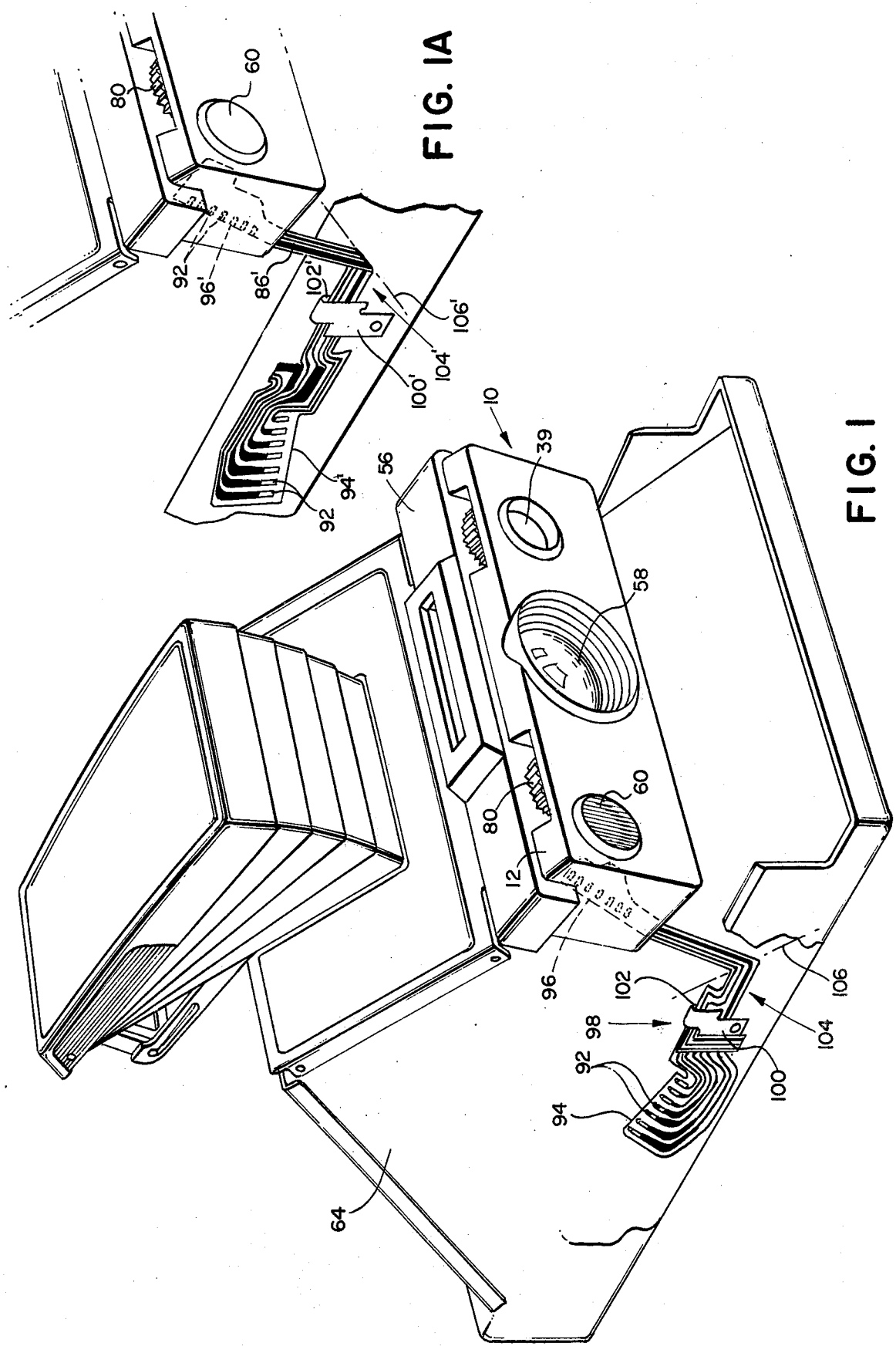

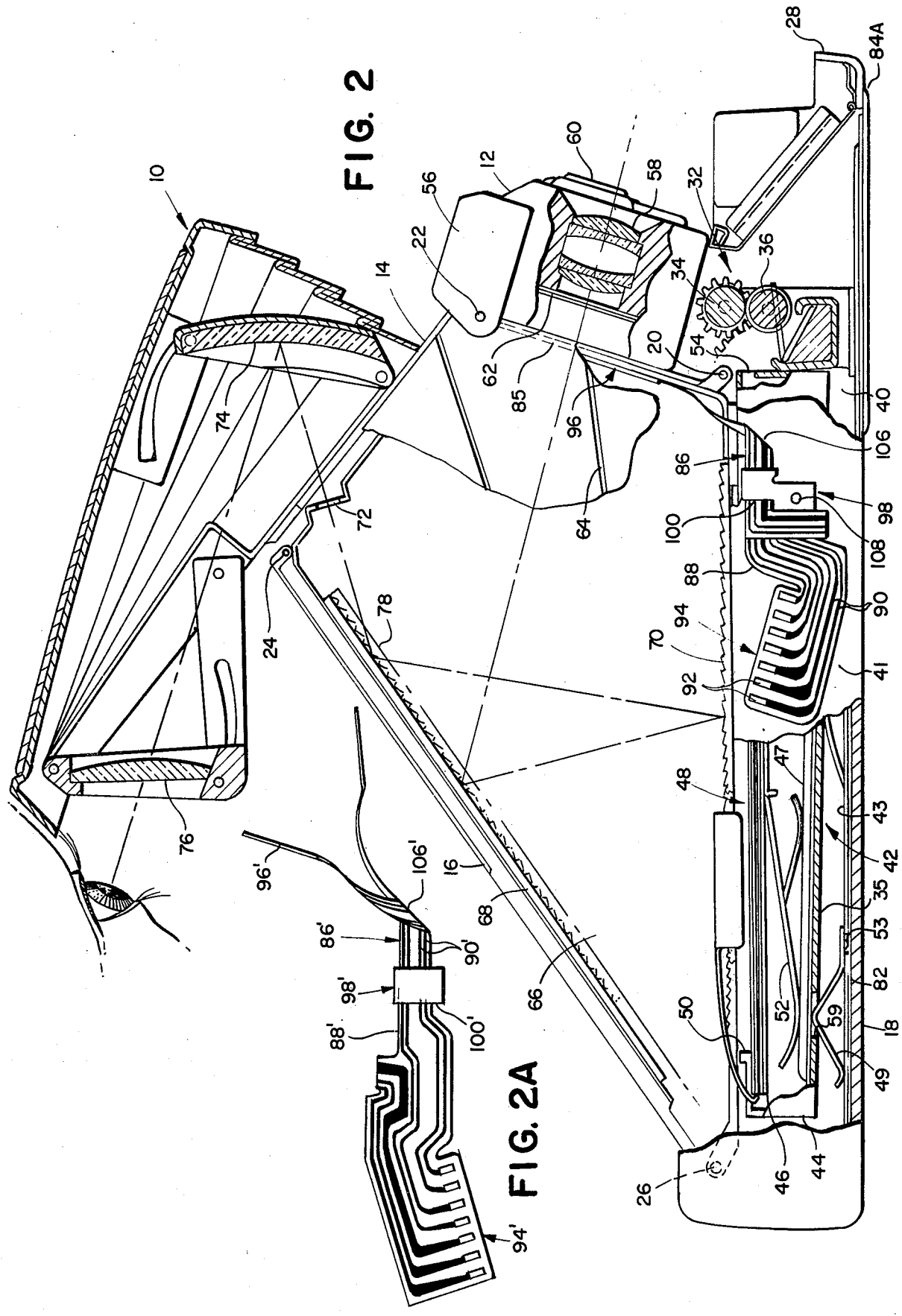

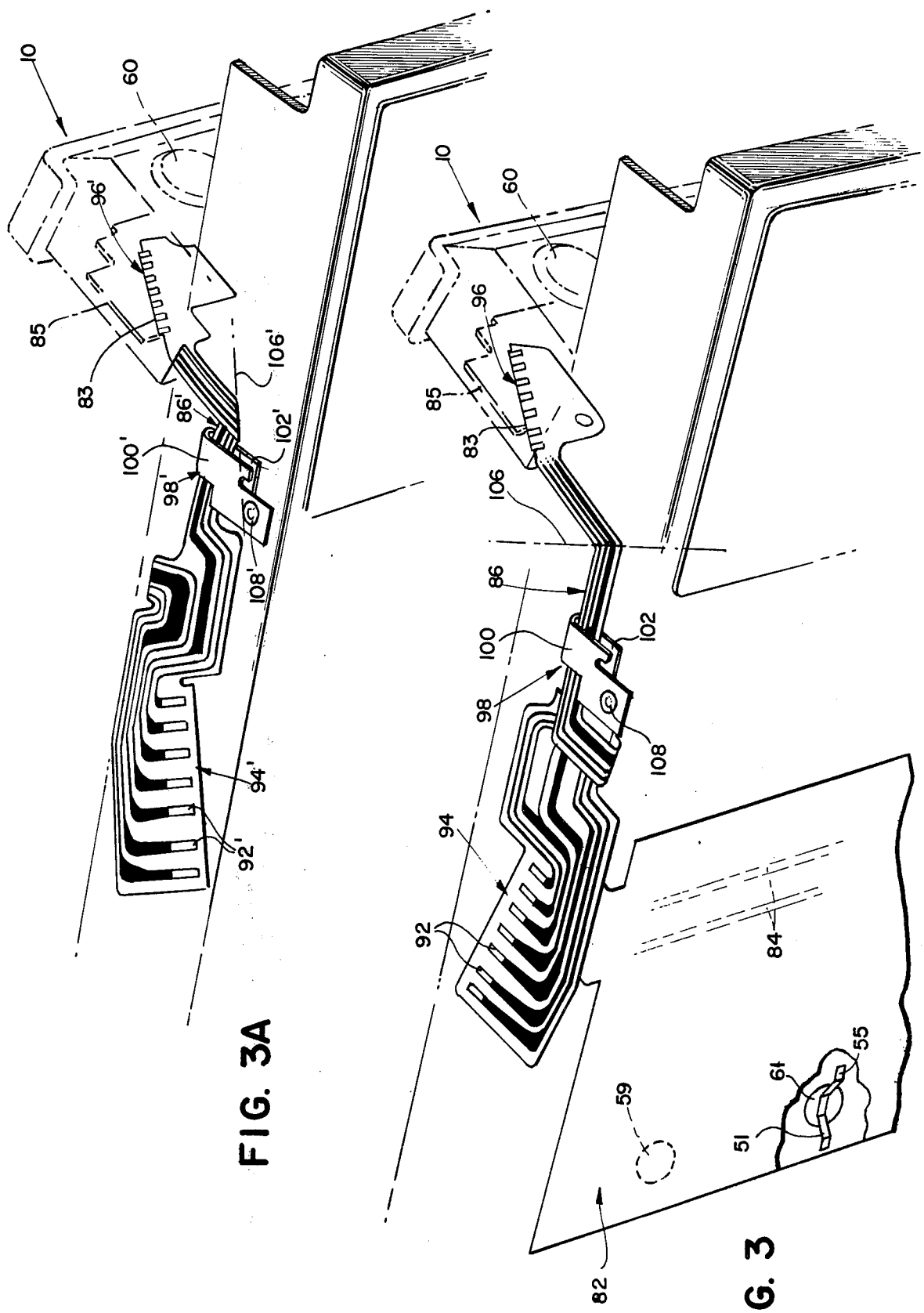

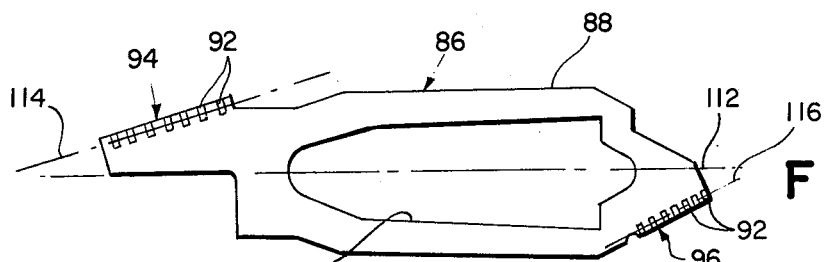
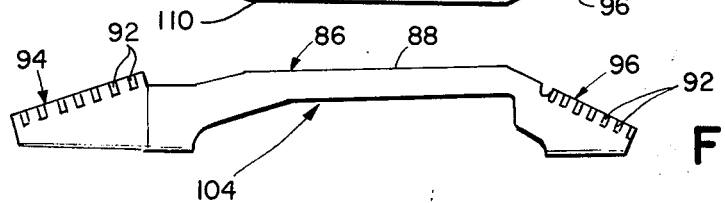
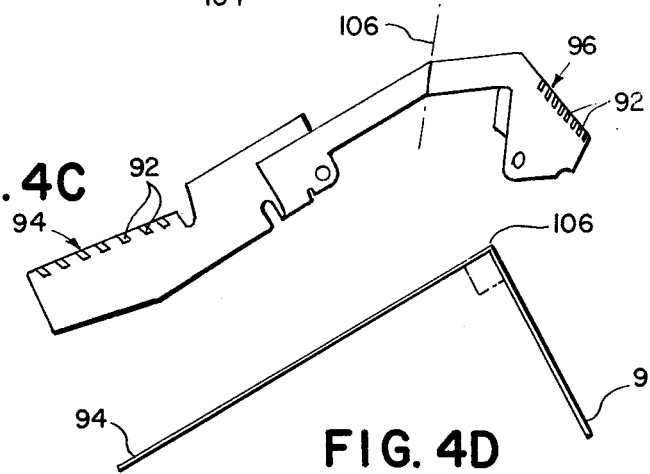
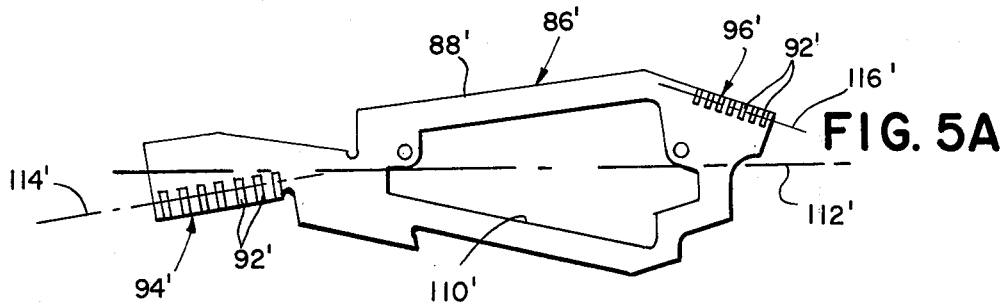
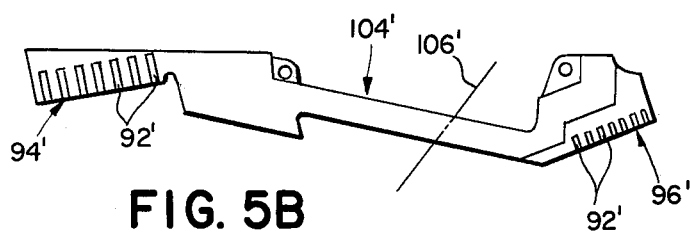

CIRCUIT BOARD ARRANGEMENT FOR COLLAPSIBLE CAMERA APPARATUS

BACKGROUND OF THE INVENTION

1. Field of the Invention

The present invention relates to a photographic apparatus and more particularly to a collapsible photographic apparatus having a flexible printed circuit board interconnecting the movable portions thereof.

2. Description of the Prior Art

Thin and compact photographic cameras of the fully automated type have been proposed wherein the exposure of the film unit is controlled electronically, immediately following which the disclosed film unit is rapidly processed at a self-contained processing station. A version of such a camera having a compactness and thinness suited to permit convenient carrying in a pocket of a garment is described in a U.S. patent entitled "Reflex Camera" by E. H. Land, U.S. Pat. No. 3,672,281. Such cameras are of the single lens reflex variety and require a complex control system in order to accommodate a requisite viewing and focusing mode during which time the single lens reflex camera is in a normally open status to unblock the passage of light through the exposure opening to a viewfinder. At the commencement of an exposure cycle, the shutter mechanism of the camera exposure control system is driven into a closed or light blocking orientation whereupon the photographic camera is automatically operated to change from the viewing and focusing mode to an exposure mode in which photosensitive film is made accessible to an optical path of the taking lens of the camera. When the camera has assumed the exposure mode of operation, the exposure control system operates to release a shutter mechanism from its light blocking orientation wherein such exposure control parameters as exposure interval and aperture size are controlled as a function of scene brightness as evaluated with respect to the sensitometric characteristics of the film being exposed. At the termination of the electronically determined exposure interval, the shutter is again driven to a fully closed or light blocking position to terminate exposure until such time as the camera reassumes the viewing and focusing mode.

Single reflex photographic cameras of the above described type are suitable for use with film units described in detail in U.S. patent to E. H. Land U.S. Pat. No. 3,415,644 entitled "Novel Photographic Products and Processes". Such film units include all of the materials necessary to produce a positive photographic print by an image forming process which is now well known in the art and involves the formation of transverse image forming substances in an exposed photosensitive element by their diffusion in a manner forming a visual positive image.

Single reflex photographic cameras of the above described type are collapsible into a thin compact configuration in order to facilitate the ease with which such cameras may be carried when not in actual use. The camera thus includes a plurality of housing sections that are pivotally connected to one another for relative movement between the extended operable condition and the compact collapsed condition. The pivotal relationship of the housing sections necessitates that a flexible electrical connection be provided between at least two housing sections in order to provide power from a planar battery disposed within the film unit to an exposure control system stationed within an adjacent housing section which pivots with respect to the film unit housing. Such a flexible electrical connection may be provided by a typical multistrand cable arranged to flex in accordance with the erecting and collapsing of the subject camera. Such multi-strand cables, however, have proved expensive to manufacture and install, and would preferably be replaced by more economical printed circuit boards. However, difficulty arises due to the required orientation and direction of travel of the terminal portions with respect to each other wherein one terminal portion is required to pivot about an axis orthogonal to the plane of the other terminal portion. In order that the printed circuit board not fracture under repetitive flexing, it is necessary that the board be flexed in a gradual manner over an extended length portion thereof. In other words, eventhough the printed circuit board may be flexible, it would still fracture in a relatively short time if it is flexed continuously about a sharp fold or crimp.

However, because of the specific spatial relationships required of the end terminal portions with respect to each other, it is necessary that the printed circuit board be sharply folded in order to interconnect the end terminal portions. Therefore, any pivotal motion between the respective planes of each terminal portion, as initiated by either the erecting or collapsing of the subject camera, must not operate to flex the printed circuit board about the fold line lest the printed board fracture.

Therefore, it is a primary object of this invention to provide a collapsible camera apparatus having two pivotally connected sections interconnected by a printed circuit board.

It is also an object of this invention to provide a collapsible camera apparatus having two sections with respective terminal portions interconnected by a flexible printed circuit board wherein said terminal portions are orthogonally arranged with respect to each other.

It is a further object of this invention to provide a collapsible camera apparatus having at least two pivotally interconnected sections interconnected by a prefolded printed circuit board wherein pivotal motion between the respective sections operates only to flex the printed circuit board in a gradual manner over an extended length portion thereof with substantially no flexing taking place about the prefold line.

It is an even further object of this invention to provide a collapsible photographic apparatus having at least two pivotally connected sections with respective terminal portions interconnected by a flexible printed circuit board prefolded in a manner to accommodate an orthogonal relationship between the terminal portions wherein pivotal motion between the camera sections operates to flex the printed circuit board only in a gradual manner over an extended length portion of the printed circuit board without any substantial flexing taking place about the printed circuit prefold line.

SUMMARY OF THE INVENTION

A collapsible camera apparatus comprises at least two substantially rigid sections connected in pivotal relationship with respect to each other. A substantially planar surface associated with one of the sections pivots about a line orthogonal to a second substantially planar surface associated with the other section. The collapsible camera apparatus additionally includes a circuit board angularly prefolded in interconnecting relation between the planar surfaces in a manner whereby the angular prefold remains substantially uneffected by pivotal motion between the sections. Pivotal motions between the sections is accommodated by the circuit board flexing in a gradual manner over an extended length portion thereof apart from the angular prefold.

More particularly, the circuit board means may include a flexible substantially planar insulating support member having spaced-apart terminal portions in respective juxtaposed relation with respect to the respective camera sections. Each terminal portion includes at least one conductive pad wherein the conductive pads are interconnected in a select manner by at least one conductive run in juxtaposed relation with respect to the circuit board means and wherein the angular prefold is located intermediate the terminal portions.

In the preferred embodiment, the conductive runs and pads overlie only one surface of the support member which is then folded in a manner so as not to disrupt the terminal portions thus permitting the conducting runs to be overlapped in a manner reminiscent of a circuit board having conductive runs deposed on opposite sides thereof. There may also be included clamping means for retaining a part of the support member closely adjacent the angular prefold in substantial coplanar relationship with one of the spaced-apart terminal portions such that that part of the support member connecting the angular prefold with the other spaced-apart terminal portion may be flexed in a gradual manner over an extended length portion thereof to accommodate pivotal motion between the camera sections without flexing the support member about the angular prefold line. The clamping means may include two generally planar surfaces for engaging opposite sides of the circuit board wherein the planar surfaces diverge slightly to accommodate slight tortional movement of the clamp part of the circuit board with respect to its coplanar terminal portion.

BRIEF DESCRIPTION OF THE DRAWINGS

The novel features that are considered characteristic of the invention are set forth with particularity in the appended claims. The invention itself, however, both as to its organization and method of operation together with other objects and advantages thereof will be best understood from the following description of the illustrated embodiment or when read in connection with the accompanying drawings wherein like members have been employed in the different figures to denote the same parts and wherein:

FIG. 1 is a perspective view, partly in cross section, depicting a collapsible camera apparatus embodying the printed circuit board arrangement of this invention.

FIG. 1A is a broken-away perspective view, partly in cross section, of an alternate arrangement for the collapsible camera apparatus of FIG. 1.

FIG. 2 is a side view, partly in cross section, showing the collapsible camera apparatus printed circuit board arrangement of FIG. 1.

FIG. 2A is a side view showing the printed circuit board arrangement of FIG. 1A.

FIG. 3 is a broken-away perspective view, partly in cross section, of the collapsible camera apparatus printed circuit board arrangement of FIG. 1.

FIG. 3A is a broken-away perspective view of the printed circuit board arrangement of FIG. 1A.

FIG. 4A is a plan view showing the printed circuit board of FIG. 1 prior to incorporation in the collapsible camera apparatus of FIG. 1.

FIG. 4B is a plan view showing the printed circuit board of FIG. 4A folded along a first fold line.

FIG. 4C is a perspective view of the printed circuit board of FIG. 4B folded along a second fold line.

FIG. 4D is a side edge view of the printed circuit board of FIG. 4C.

FIG. 5A is a plan view of the printed circuit board of FIG. 1A.

FIG. 5B is a plan view of the printed circuit board of FIG. 5A as folded along a first fold line.

DESCRIPTION OF THE PREFERRED EMBODIMENTS

In its illustrated embodiment, the present invention is depicted as being incorporated in a compact, collapsible camera 10 for use with self-developing film. The camera 10 generally conforms to the camera structure described in considerable detail in U.S. Pat. No. 3,714,879 entitled "Reflex Camera" by Edwin H. Land, et. al. The camera 10 is illustrated in its operative condition in FIG. 1. Referring now to FIG. 1 in conjunction with FIG. 2, it will be seen that camera 10 includes a plurality of housing sections 12, 14, 16 and 18 that are pivotally connected to one another at pivots 20, 22, 24 and 26 for relative movement between the extended operative condition of FIGS. 1 and 2 and a compact, collapsed condition (not shown). Additionally, a housing member 28 extending in front of housing member 18 is pivotally connected thereto at pivot (not shown) for movement in a clockwise direction as viewed in FIG. 2. Housing member 28 includes means for mounting a fluid processing assembly 32 including juxtaposed spreader members 34 and 36 urged toward one another by resilient biasing means.

When the camera 10 is disposed in its extended operative condition of FIGS. 1 and 2 the fluid processing assembly 32 is positioned across an entrance 40 to a film magazine chamber 42. The film magazine chamber 42 comprises two spaced apart, substantially parallel, longitudinal side walls (the closest of which is shown at 41) extending upwardly from a substantially planar base plate 43. The pivotal connection between housing members 18 and 28 permits the latter to be rotatably moved with respect to the former to move fluid processing assembly 32 from its blocking position across entrance 40 thereby creating access to film magazine chamber 42 so that a film magazine 44 may be loaded therein. Each film magazine 44 includes a plurality of film units 46. Additionally, each such film magazine 44 is provided with a picture framing aperture 48, not shown in full, but defined in part by longitudinal edge portions 50 of film magazine 44. When the film magazine 44 is properly located within the film magazine chamber 42, framing aperture 48 becomes positioned so that it is aligned with the optical system of camera 10 to facilitate exposure operations and picture framing. Within film magazine 44 is a spring assembly 52 that continuously urges the film units 46 toward framing aperture 48 so that the outermost film unit is located in the focal point of camera 10 for exposure purposes. An elongated opening 54 is provided in the housing of film magazine 44 to facilitate advancement of each film unit 46 from the magazine towards the fluid processing assembly 32 after an exposure is made.

The section 12 comprises a housing 56 for the camera's lens assembly 58, an actuator button 60, and a shutter assembly 62, not shown in detail, but disposed within housing 56 and comprising suitable electro-optical-mechanical means for determining and regulating exposure intervals. Such electro-optical-mechanical means may include an automatic exposure control system to evaluate scene brightness for levels of illumination, weight this evaluation with respect to the sensitometric characteristics of a film being exposed and regulate one or more variable exposure control parameters such as exposure interval or aperture size in correspondence with the weighted evaluation. Scene brightness evaluation for the system is performed with light measuring circuits, not shown, utilizing one or more photosensitive elements shown generally at 39. The photosensitive elements 39 are aligned to be responsive to the light characteristics of a scene approximately coincident with the field of view of the camera lens assembly 58. Additionally, member 12 in cooperation with members 14, 16, 18 and collapsible bellows 64 define a six-sided exposure chamber 66.

The optical system of camera 10 in addition to lens assembly 58 further comprises optical means that cooperate with lens assembly 58 to provide alternate folded light paths for light rays emanating from the scene and passing through the lens elements of lens assembly 58. The nature of these light paths and the associated means for producing them may thus be understood by relating them respectively to the modes of operation of camera 10 while it is in its extended operative condition. The modes of operation referred to may be conveniently classified in functional terms as the viewing and focusing mode and the exposing and processing mode. In the viewing and focusing mode, an image of the scene is brought to the users eye as rays from the scene pass through the lens elements of lens assembly 58 and reflect from a fixed mirror 68 located on the interior wall of housing member 16. Located immediately above and overlying the focal plane of camera 10 is a Fresnel mirror 70 which takes the light rays reflected from fixed mirror 68 and redirects them in a focused bundle of rays back to mirror 68 from whence they pass through a small exit hole 72 onto an aspheric mirror 74. From the aspheric mirror 74, the light rays pass through a magnifying eye lens 76 which facilitates viewing the scene.

During the exposure processing mode, Fresnel mirror 70 is displaced from its position overlying the focal plane of camera 10 to a position immediately adjacent to an overlying fixed mirror 68. Shown in phantom in FIG. 2 on the reverse side of the Fresnel mirror 70 is seen a plane mirror 78 rigidly attached thereto which reflects light rays coming in through the lens elements of lens assembly 58 onto the surface of the film unit 46.

This arrangement of optical elements provides the camera 10 with a single lens reflex capability which permits the camera user to select a subject matter of the scene and subsequently focus the image for best sharpness. Located in housing section 56 is a focus wheel 80 which when rotated causes a forward-rearward displacement of the lens elements in lens assembly 58 thereby permitting the user to adjust the sharpness of the subject matter image.

To initiate the exposing and processing mode of operation of camera 10, a user depresses actuator button 60 located in housing 56. The depression of actuator button 60 engages means, not shown, in camera 10 which effects a sequential series of camera system operations that ultimately result in a finished photograph. The first of these operations closes a normally open shutter 62 located in housing 56 thus producing an internal light-tight condition in exposure chamber 66. Subsequently the Fresnel 70 moves from its position covering the focal plane of camera 10 to its position shown in phantom in FIG. 2 thereby uncovering photosensitive film unit 46 and positioned to direct light rays coming from the focused subject matter to the film unit 46 instead of the alternate path to the eye. Shutter 62 then reopens and the exposure is begun. After an appropriate exposure interval as determined by the electro-optical-mechanical means previously described, the shutter 62 again closes and the exposure chamber 66 is again in a light-tight condition. At this time the Fresnel 70 is automatically repositioned to cover the exposed film unit and return exposure chamber 66 to its initial state. While the Fresnel 70 is returning to its initial position covering the focal plane of camera 10, a sequence of events is initiated during which the exposed film unit 46 is automatically advanced through the elongated opening 54 of film magazine 44 and into operative relationship with fluid processing assembly 32. After the exposed film unit 46 passes through an exit slot 84A, shutter 62 then reopens and chamber 10 returns to its viewing and focusing mode.

Referring now to the film magazine 44 there is included a planar battery 47 which is disposed adjacent a bottom wall 35 of the film magazine. The planar battery 47 may include a card of relatively stiff cardboard or similar material which carries an electro-chemical cell assembly having positive and negative terminals. The bottom wall 35 of the film magazine 44 has a pair of openings 59 and 61, as best seen in FIG. 3, disposed in side-by-side relationship relative to the direction of cassette insertion. The openings 59, 61 are spaced such that they register respectively with the positive and negative terminals of the planar battery 47. Electrical contact means in the form of a pair of electrically conductive leaf spring contacts 49, 51 are provided for interfacing the electrical system with the planar battery 47. The electrical contacts 49 and 51 are connected in fixed spaced apart relation relative to the film magazine chamber base plate 43. Underlying the base plate 43 is provided a printed circuit board 82 having a plurality of spaced apart conductive runs 84, two of which connect respectively to the ends of electrical contacts 49 and 51 at respective terminals 53 and 55. As is readily apparent, printed circuit board 82 wraps around the edge of magazine base plate 43 so as to overlie a portion of the longitudinal side wall 41.

The above described electro-optical-mechanical means disposed within housing 56 also includes a printed circuit board 85, the edge portion of which is shown in FIG. 2. The printed circuit board 85 has a plurality of spaced apart conductive runs (not shown) interconnecting a plurality of electrical components (also not shown) to a terminal portion comprised of a plurality of connecting pads 83 which are ordinarily wider than the conductive runs. A flexible electrical connection must be provided between the printed circuit board 82 and the printed circuit board 85 in order to provide power from the planar battery 47 to the electro-optical-mechanical means stationed within housing 56 and it is to this end that the instant invention is directed. Thus the proceeding is a brief description of the structure and operation of a folding reflex camera 10 to provide the necessary background for a description of the novel low cost flexible printed circuit board means of this invention.

Referring now to FIGS. 1, 2 and 3 there is shown a printed circuit board 86 fabricated on a flexible insulating supporting member 88 on which are deposited, in juxtaposed relation, a plurality of electrically conducting runs 90. The printed circuit board 86 includes two spaced apart terminal portions 94 and 96 connected in respective juxtaposed relation to the terminal portions of printed circuit boards 82 and 85. Terminal portions 94 and 96 each include a plurality of spaced apart connecting pads 92 which connect to the ends of respective conductive runs 90. Between the terminal portions 94 and 96 of the printed circuit board 86 there is included an elongated portion 104 through which the conductors 90 run.

As is readily apparent, the terminal portions 94 and 96 are substantially planar portions interconnected by the flexible elongated portion 104 which in the unflexed state also remains substantially planar. Difficulty arises due to the required orientation and direction of travel of terminal portion 96 with respect to terminal portion 94. Terminal portion 96 must be able to sustain repetitive pivotal motion with housing section 12 about the pivot point 20, however, as is readily apparent the plane of terminal portion 96 pivots about an axis orthogonal to the plane of terminal 94. In order that the printed circuit board 86 not fracture under repetitive flexure, it is necessary that the flexure be in a gradual manner over an extended length portion of the printed circuit board. In other words, even though the printed circuit board is described as being flexible, it would nevertheless fracture within a relatively short time if it is continuously flexed about a sharp fold or crease. Because of the orientations of the terminal portions 94 and 96 with respect to each other, it is necessary that the printed circuit board 86 be prefolded in order to interconnect the terminal portions, however, any pivotal motion between the respective planes of each terminal portion 94, 96 must not operate to flex the printed circuit board about the prefold line lest the printed circuit board fracture within a relatively short time.

The printed circuit board 86 of this invention is angularly and permanently prefolded along the prefold line 106, in this manner accommodating an orthogonal relation between the terminal portions 94 and 96. That part of the printed circuit board between the prefold line 106 and the terminal portion 96 is flexed in a gradual manner over substantially the entire length thereof so as to accommodate pivotal motion of the housing section 12 relative to the housing section 18.

A clamp 98 is provided in fixed connection to the film magazine chamber side wall 41 and includes two generally planar side walls 100 and 102 for engaging opposite sides of the circuit board 86 wherein the planar side walls 100 and 102 diverge slightly to accommodate slight tortional movement of the clamped portion of the circuit board with respect to the terminal portion 94. Clamp 98 may be fastened to the longitudinal side wall 41 by means such as a rivot 108. Rotation of the housing section 12 about the pivot 20 operates to flex printed circuit board 86 in a gradual manner only in the area intermediate the prefold line 106 and the terminal portion 96 without any substantial flexing taking place about the prefold line 106. Collapsible cameras embodying the printed circuit board arrangement of this invention have been successfully cycled as many as 50,000 times without fracturing the printed circuit board 86.

Referring now to FIG. 4A through 4D there is shown a preferred arrangement for the printed circuit board 86 of this invention wherein the conductive pads 92 of the spaced apart terminal portions 94 and 96 are interconnected by respective conductive runs 90. The flexible insulating support member 88 may be comprised of a solid organic resin such as polyester, known as Mylar, manufactured by the Dupont Chemical Company. In the event that the camera apparatus 10 is to be employed in an ambient temperature extending above 175° c., a material such as Kapton could be employed for the support member 88. Kapton is capable of maintaining its characteristics up to a temperature range of 250° to 350° centigrade. Other satisfactory flexible electrical insulating materials such as Kel-F might also be suitably employed as the supporting member 88.

Conductive runs 90 together with the conductive pads 92 may be fabricated of an electrically conductive material such as copper formed on the insulating supporting member 88, in accordance with well known printed conductor techniques such as electrodeposition and subsequent etching, or by etched foil techniques such as are described in U.S. Pat. No. 2,911,605, or other similar techniques. The flexible electrically insulating supporting member 88 may have a thickness of about 0.001 to 0.005 inches. This thickness may vary above or below the value cited, however, these values are believed to be typical and may differ somewhat for a different flexible insulating material such as Kapton. The conductive runs 90 and the conductive pads 92 may have a typical thickness of about 0.003 inches and may comprise etched copper foil or electrodeposited copper runs and the like.

In order to avoid shorting out various conductive runs 90 there may be provided an overlying protective electrical insulating layer which conforms substantially to the silhouette of the printed circuit board and which extends over substantially the entire surface area of the printed circuit board 86 excluding the conductive pads 92 where it is desired to provide for external connections to the other printed circuit boards. The overlying insulating layer may comprise a 0.002 inch thickness or less Mylar member which is heat sealed or glued along the edges of the printed circuit board or the corners of that portion of the printed circuit board where it is desired that the overlying insulating layer extend. The overlying insulating layer may comprise some other informal seal for the printed circuit board such as an epoxy resin coating, etc.

In an alternative embodiment the printed circuit board of this invention may comprise a thin layer of copper bonded with epoxy to a thin layer polyamide film or Teflon film. The conductive pads 92 and conductive runs 90 would then be formed in the copper by etching; and a thin layer of Teflon film or polyamide film or polyester film may be bonded to the copper with epoxy so that the copper is completely covered in the area of conductive runs 90. The resulting cable would be thin enough, about 4 mils, to be quite flexible. A solder plating is generally applied to the conductive pads 92 in order to facilitate subsequent soldering.

Referring now specifically to FIG. 4A there is shown a particular configuration for a desired embodiment of the printed circuit board of this invention. It will be appreciated that a center portion of the circuit board as outlined at 110 has been removed for reasons which will become apparent for the subsequent discussion. After the conductive runs 90 and the conductive pads 94 together with the overlying insulating layer have been applied in the above described manner, the printed circuit board 86 is folded along the fold line 112 to provide the configuration as shown in FIG. 4B. The conductive runs 90 now overlap in a manner reminiscent of a printed circuit board assembly having conductive runs deposed on the opposed surfaces of the insulating member.

In this manner the printed circuit board 86 is provided with overlapping conductors without incurring the expense and complexity involved in providing conductive runs on opposite sides of the insulating member 88. The printed circuit board 86 is next angularly prefolded along the prefold line 106 such that the terminal portions 94 and 96 bear an orthogonal relationship to each other as best seen in FIG. 4D where the prefold line 106 extends in a direction normal to the plane of the drawing. The terminal portions 94 and 96 may also be respectively folded along the fold lines of 114 and 116 in order to facilitate subsequent soldering.

The printed circuit board 86 of FIG. 4 is then stationed as shown in FIGS. 1 through 3 such that the conductive pads 92 of terminal portion 94 register with corresponding conductive pads at the ends of conductive runs 84 on circuit board 82 while conductive pads 92 on terminal portion 96 register with corresponding conductive pads on printed circuit board 85. Whereas the conductive pads 92 have been pre-soldered and folded over in the above described manner it is only necessary to apply heat to the exposed portions of the conductive pads 92 wherein the heat is conducted around the folds 112 and 114 so as to melt and fuse the solder between corresponding conductive pads on the respective terminal boards 82, 85 and 86.

Referring now to FIGS. 5A and 5B there is shown in alternate arrangement for the printed circuit board of this invention wherein the circuit board 86' is folded along the fold lines 106', 112', 114' and 116'. The printed circuit board of FIGS. 5A and 5B is shown in its connected position in FIGS. 1A, 2A and 3A, and as is readily apparent, the angular prefold along the prefold line 106' operates in the same manner to orient the terminal portions 94' and 96' in orthogonal relation such that pivotal motion of the housing section 12 relative to the housing section 18 operates to flex the printed circuit board 86' in a gradual manner over an extended length portion thereof in the area intermediate the prefolded line 106' and the terminal portion 96' without any substantial flexing taking place about the fold line 106'.

This invention may be practiced or embodied in still other ways without departing from the spirit or essential character thereof. The embodiment described herein is therefore illustrative and not restrictive, the scope of the invention being indicated by the appended claims in all variations which come within the meaning of the claims are intended to be embraced therein.

What is claimed is:

1. A collapsible camera apparatus comprising:
a first body section having a first substantially planar surface associated therewith;
a second body section having a second substantially planar surface associated therewith;
means for pivotally connecting said first and second body sections such that said first substantially planar surface is disposed for pivotal motion about an axis orthogonal to said second substantially planar surface; and
a flexible circuit board including a flexible substantially planar insulating support member defining spaced apart first and second terminal portions in respective juxtaposed relation with respect to said first and second planar surfaces and interconnected by an elongated portion, said first and second terminal portions respectively including a plurality of spaced apart conductive pads in overlying relation thereto and interconnected respectively by a plurality of spaced apart conductive runs overlying said elongated portion, said flexible circuit board additionally being angularly and permanently prefolded about a single prefold line extending across said elongated portion with that part of said elongated portion extending from said prefold line to said first terminal portion assuming a gradual flexed condition over substantially the entire length thereof so that pivotal movement of the first planar surface about its axis orthogonal to the second planar surface operates to alter said flexed condition in a gradual manner only in the area of said elongated portion intermediate said prefold line and first terminal portion without any substantial flexing taking place about said prefold line.

2. The collapsible camera of claim 1 wherein said angular prefold orients said spaced apart terminal portions of said support member in substantial orthogonal relation with respect to each other and said substantial orthogonal relationship is maintained throughout said pivotal movement between said sections.

3. The collapsible camera of claim 1 including clamping means for retaining a part of said support member closely adjacent said angular prefold in substantial coplanar relationship with said second terminal portion.

4. The collapsible camera of claim 3 wherein said clamping means include two generally planar surfaces for engaging opposite sides of said circuit board, said planar surfaces diverging slightly to accommodate slight torsional movement of the clamped part of the board with respect to its coplanar second terminal portion.

5. The collapsible camera of claim 3 wherein each conductive pad is precoated with solder and prefolded in order that heat applied to one side of the prefolded pad will operate to melt the solder on the opposite side of the prefolded pad.

* * * * *